US010403745B2

(12) United States Patent
Higuchi et al.

(10) Patent No.: US 10,403,745 B2
(45) Date of Patent: Sep. 3, 2019

(54) NITRIDE SEMICONDUCTOR DEVICE INCLUDING A HORIZONTAL SWITCHING DEVICE

(71) Applicant: DENSO CORPORATION, Kariya, Aichi-pref. (JP)

(72) Inventors: Yasushi Higuchi, Kariya (JP); Shinichi Hoshi, Kariya (JP); Kazuhiro Oyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/578,403

(22) PCT Filed: Jun. 14, 2016

(86) PCT No.: PCT/JP2016/002871
§ 371 (c)(1),
(2) Date: Nov. 30, 2017

(87) PCT Pub. No.: WO2017/010040
PCT Pub. Date: Jan. 19, 2017

(65) Prior Publication Data
US 2018/0219086 A1   Aug. 2, 2018

(30) Foreign Application Priority Data
Jul. 14, 2015   (JP) .................... 2015-140825

(51) Int. Cl.
*H01L 29/778*   (2006.01)
*H01L 29/08*   (2006.01)
(Continued)

(52) U.S. Cl.
CPC ...... *H01L 29/7783* (2013.01); *H01L 29/0843* (2013.01); *H01L 29/1066* (2013.01);
(Continued)

(58) Field of Classification Search
CPC ............ H01L 29/7783; H01L 27/098; H01L 29/4236; H01L 29/778; H01L 29/78; H01L 29/808; H01L 29/812
(Continued)

(56) References Cited

U.S. PATENT DOCUMENTS

2002/0017648 A1* 2/2002 Kasahara .......... H01L 21/28575
257/79
2010/0044752 A1* 2/2010 Marui ............... H01L 29/66462
257/192
(Continued)

FOREIGN PATENT DOCUMENTS

JP   2001-358075 A   12/2001
JP   5302553 B2   10/2013

OTHER PUBLICATIONS

Ohi, Kota and Hashizume, Tamotsu, "Drain Current Stability and Controllability of Threshold Voltage and Subthreshold Current in a Multi-Mesa-Channel AlGaN/GaN High Electron Mobility Transistor", Japanese Journal of Applied Physics 48 (2009) 081002, pp. 81002-1-81002-5, (2009).

*Primary Examiner* — Didarul A Mazumder
(74) *Attorney, Agent, or Firm* — Posz Law Group, PLC

(57) ABSTRACT

A nitride semiconductor device includes a horizontal switching device that includes a substrate, a channel forming layer, a source region, a drain region and a gate region. The source region and the drain region are arranged apart from each other in one direction along a plane of the substrate. The gate region is formed of a p-type semiconductor layer and is arranged between the source region and the drain region. The gate region is divided into multiple parts in a perpendicular direction along the plane of the substrate, the perpendicular direction being perpendicular to an arrangement direction in which the source region and the drain region are (Continued)

arranged. Accordingly, on-resistance is decreased while securing high breakdown voltage.

10 Claims, 8 Drawing Sheets

(51) Int. Cl.
    *H01L 29/40*       (2006.01)
    *H01L 29/423*     (2006.01)
    *H01L 29/66*       (2006.01)
    *H01L 29/20*       (2006.01)
    *H01L 29/78*       (2006.01)
    *H01L 29/10*       (2006.01)

(52) U.S. Cl.
    CPC ........ *H01L 29/407* (2013.01); *H01L 29/4236* (2013.01); *H01L 29/66462* (2013.01); *H01L 29/778* (2013.01); *H01L 29/78* (2013.01); *H01L 29/2003* (2013.01)

(58) Field of Classification Search
    USPC .......................................................... 257/76
    See application file for complete search history.

(56) References Cited

U.S. PATENT DOCUMENTS

| | | | |
|---|---|---|---|
| 2010/0163928 A1* | 7/2010 | Imada | H01L 29/0619 257/194 |
| 2011/0227093 A1* | 9/2011 | Hikita | H01L 29/808 257/76 |
| 2013/0105812 A1* | 5/2013 | Ishigaki | H01L 29/4236 257/76 |
| 2014/0151747 A1* | 6/2014 | Jeon | H01L 29/42316 257/194 |

* cited by examiner

NITRIDE SEMICONDUCTOR DEVICE INCLUDING A HORIZONTAL SWITCHING DEVICE

CROSS REFERENCE TO RELATED APPLICATIONS

This application is a U.S. national stage application of International Patent Application No. PCT/JP2016/002871 filed on Jun. 14, 2016 and is based on Japanese Patent Application No. 2015-140825 filed on Jul. 14, 2015, the disclosure of which is incorporated herein by reference.

TECHNICAL FIELD

The present disclosure relates to a nitride semiconductor device including a nitride semiconductor such as gallium nitride (hereinafter, referred to as GaN).

BACKGROUND ART

Conventionally, patent literature 1 discloses a technique for achieving normally-off and low on-resistance in a nitride semiconductor device including multiple channels. Specifically, a hetero-junction unit of an AlGaN layer and a GaN layer is repeatedly formed on the GaN layer to provide a natural super junction structure (hereinafter, referred to as NSJ structure). The nitride semiconductor device includes a first gate structure portion reaching the lowermost AlGaN layer of the NSJ structure and a second gate structure reaching the AlGaN layer above the lowermost AlGaN layer. The nitride semiconductor device includes a source region and a drain region formed of an n-type region at both sides of the first gate structure portion and the second gate structure portion.

In this nitride semiconductor device, each of the gate structure portions has a MOS structure. An electrostatic potential of a first gate electrode and a gate insulation film of the first gate structure portion is lower than a conductive band of the hetero-junction unit of the GaN layer and the AlGaN layer. Therefore, carries do not exist at a hetero-interface and normally-off operation is achieved. Since the nitride semiconductor device has multiple layers of hetero-junction units, a generation quantity of 2-dimensional electron gas (hereinafter, referred to as 2 DEG) is increased and an on-resistance is decreased. Also, a desired off-breakdown voltage is achieved by a polarization effect regardless of a stacked number of the hetero-junction units.

PATENT LITERATURE

Patent literature 1: JP 2013-98284 A

SUMMARY

However, in the nitride semiconductor device in which each gate structure portion has the MOS structure in order to achieve the normally-off operation, an electrical field intensity needs to be decreased by increasing a gate-drain distance so as to secure a life of the gate insulation film. For example, the electrical field intensity needs to be less than 3 MV/cm in view of the life of the gate insulation film. Therefore, there is a possibility that a resistance is not sufficiently decreased and the on-resistance is increased.

Also, a gate length Lg needs to be increased in order to secure current barrier properties because the electrical field intensity satisfying the life of the gate insulation film is still high. The gate structure portion has channel mobility lower than a portion including the 2 DEG by almost one digit and the on-resistance is more likely to be affected by increasing the gate length Lg.

When the 2 DEG layers generated in the multiple layers of the hetero-junction units have sufficient electron concentration, 2-dimensional hole gas (hereinafter, referred to as 2 DHG) is generated at the same time. However, the MOS structure does not take in and take out the holes and there is a possibility that high electrical field is generated in an off state by the holes accumulated at the side of the gate. In this case, there is a possibility that a high breakdown voltage is not achieved.

It is an object of the present disclosure to provide a nitride semiconductor device capable of decreasing an on-resistance while securing a high breakdown voltage.

According to an aspect of the present disclosure, a nitride semiconductor device includes a horizontal switching device. The horizontal switching device includes a substrate, a channel forming layer, a source region, a drain region, and a gate region. The substrate is formed of a semi-insulator or a semiconductor. The channel forming layer includes a first nitride semiconductor layer disposed above the substrate and a hetero-junction structure disposed above the first nitride semiconductor layer. The first nitride semiconductor layer provides an electron transit layer. The hetero-junction structure includes at least one second nitride semiconductor layer and at least one third nitride semiconductor layer. The at least one second nitride semiconductor layer has a forbidden band width greater than the first nitride semiconductor layer and provides an electron donor portion. The at least one third nitride semiconductor layer has a forbidden band width less than the at least one second nitride semiconductor layer. The source region and the drain region are arranged apart from each other in one direction along a plane of the substrate. The source region and the drain region extend from a surface of the channel forming layer and reach the first nitride semiconductor layer. The gate region is formed of a p-type semiconductor layer and is arranged between the source region and the drain region.

The horizontal switching device is configured to generate a current between the source region and the drain region by a 2-dimensional electron gas carrier and a 2-dimensional hole gas carrier. The 2-dimensional electron gas carrier is induced in the first nitride semiconductor layer adjacent to an interface between the first nitride semiconductor layer and the at least one second nitride semiconductor layer. The 2-dimensional hole gas carrier is induced between the at least one second nitride semiconductor layer and the at least one third nitride semiconductor layer positioned above the at least one second nitride semiconductor layer.

The gate region is divided into multiple parts in a perpendicular direction along the plane of the substrate, the perpendicular direction being perpendicular to an arrangement direction in which the source region and the drain region are arranged.

According to the aspect of the present disclosure, when the nitride semiconductor device is in an off state, a depletion state is achieved in which an electron and a hole do not exist. The depletion state corresponds to a current cutoff state, that is, a blocking state in which a current does not flow even when a high voltage is applied to the drain region. When the nitride semiconductor device is in an on state, a region other than the gate region and a neighborhood of the gate region is filled with electrons of high-density 2 DEG. Therefore, the on state in which the source and the drain are conducted is achieved with sufficiently low on-resistance. In this case, the current does not flow in the MOS structure having high resistance but the current flows in the 2 DEG layer having quite low resistance. Therefore, the on-resistance is decreased compared to the MOS structure.

According to another aspect of the present disclosure, a nitride semiconductor device includes a horizontal switching device. The horizontal switching device includes a substrate, a channel forming layer, a source region, a drain region, and a gate region. The substrate is formed of a semi-insulator or a semiconductor. The channel forming layer includes a first nitride semiconductor layer disposed above the substrate and a hetero-junction structure disposed above the first nitride semiconductor layer. The first nitride semiconductor layer provides an electron transit layer. The hetero-junction structure includes at least one second nitride semiconductor layer and at least one third nitride semiconductor layer. The at least one second nitride semiconductor layer has a forbidden band width greater than the first nitride semiconductor layer and provides an electron donor portion. The at least one third nitride semiconductor layer has a forbidden band width less than the at least one second nitride semiconductor layer and provides the electron transit layer with the first nitride semiconductor layer. The source region and the drain region are arranged apart from each other in one direction along a plane of the substrate. The source region and the drain region extend from a surface of the channel forming layer and reach the first nitride semiconductor layer. The gate region is formed of a p-type semiconductor layer and is arranged between the source region and the drain region.

The horizontal switching device is configured to generate a current between the source region and the drain region by a 2-dimensional electron gas carrier and a 2-dimensional hole gas carrier. The 2-dimensional electron gas carrier is induced in the first nitride semiconductor layer adjacent to an interface between the first nitride semiconductor layer and the at least one second nitride semiconductor layer. The 2-dimensional hole gas carrier is induced between the at least one second nitride semiconductor layer and the at least one third nitride semiconductor layer positioned above the at least one second nitride semiconductor layer.

The gate region extends in a perpendicular direction along the plane of the substrate and separates the source region and the drain region, the perpendicular direction being perpendicular to an arrangement direction in which the source region and the drain region are arranged. The gate region is positioned above an intermediate position of the at least one second nitride semiconductor layer. According to the another aspect of the present disclosure, similar effects to the aspect of the present disclosure are achieved.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Hereinafter, embodiments of the present disclosure will be described with reference to the drawings. In the following embodiments, same or equivalent portions will be designated by the same symbols.

First Embodiment

A first embodiment of the present disclosure will be described. In the present embodiment, a nitride semiconductor device that includes a GaN device provided by a compound semiconductor device including GaN of a nitride semiconductor as a main constituent will be described.

Figure 1:
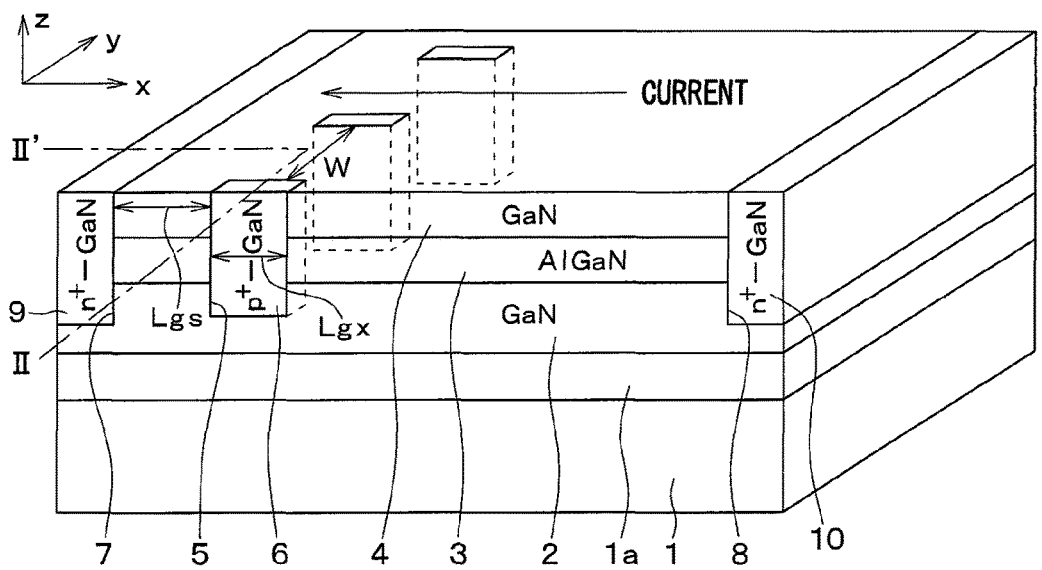
FIG. 1 is a perspective cross-sectional view of a nitride semiconductor device according to a first embodiment of the present disclosure.

As shown in FIG. 1, the nitride semiconductor device of the present embodiment includes a horizontal switching device. Although FIG. 1 only shows one cell of the switching device, actually, the switching device includes multiple cells, for example, that are symmetrically arranged with respect to a left edge of a paper of FIG. 1 as a symmetric axis. The switching device has the following structure in which a horizontal direction of FIG. 1 is defined as x direction, a depth direction of FIG. 1 is defined as y direction, and a vertical direction of FIG. 1 is defined as z direction.

The horizontal switching device includes a compound semiconductor substrate that has a structure in which a GaN layer 2, an AlGaN layer 3, and a GaN layer 4 are stacked in this order in the z direction above a surface of a substrate 1 parallel to xy plane. The GaN layer 2 and the GaN layer 4 provide an electron transit layer. The GaN layer 2 and the GaN layer 4 correspond to a first nitride semiconductor layer and a third nitride semiconductor layer. More specifically, the AlGaN layer 3 is formed of $Al_xGa_{1-x}N$ ($0<x\leq1$). The AlGaN layer 3 has a forbidden band width greater than the first and third nitride semiconductor layer and provides an electron donor portion. The AlGaN layer 3 corresponds to a second nitride semiconductor layer. In the horizontal switching device, a 2 DEG carrier is induced by piezoelectric effect and polarization effect. The 2 DEG carrier is induced in the GaN layer 2 adjacent to a GaN/AlGaN interface between the GaN layer 2 and the AlGaN layer 3 by a channel forming layer provided by the GaN layer 2 and a hetero-junction structure of the AlGaN layer 3 and the GaN layer 4.

The substrate 1 is formed of a semiconductor material such as Si(111). The compound semiconductor substrate includes a buffer layer 1a on the substrate 1. The GaN layer 2 corresponding to a first GaN layer is formed on the buffer layer 1a, and a stack structure including the AlGaN layer 3 and the GaN layer 4 as a pair is formed on the GaN layer 2. The GaN layer 4 corresponds to a second GaN layer. Although the substrate 1 is formed of Si(111) in the present embodiment, the substrate 1 may be formed of SiC, a sapphire substrate, a semi-insulator substrate such as AlN, and the like.

The buffer layer 1a is formed as necessary in order to improve a crystallinity of the GaN layer 2. For example, the buffer layer 1a is formed of AlGaN—GaN superlattice layer. For example, the crystallinity is a defect or a dislocation in the GaN layer 2 affecting electrical and optical characteristics. When the GaN layer 2 is formed on the substrate 1 with good crystallinity, the buffer layer 1a may be omitted.

For example, the GaN layer 2, the AlGaN layer 3 and the GaN layer 4 are formed by hetero-epitaxial growth. A thickness of each of the GaN layer 2, the AlGaN layer 3 and the GaN layer 4 is set so as to generate the same number of plus and minus polarized charges (i.e., a plus polarized charge and a minus polarized charge) as more than one pair of 2 DEG and 2 DHG. Also, the thickness is set so as to satisfy a neutral condition as a whole in a depletion state.

That is, in each layer, the plus polarized charge is generated at an interface between the GaN layer 2 and the AlGaN layer 3, and the minus polarized charge is generated at an interface between the AlGaN layer 3 and the GaN layer 4. In the present embodiment, the thickness of the AlGaN layer 3 is equal to or greater than a specific value. The 2 DEG is generated in the GaN layer 2 adjacent to the interface between the GaN layer 2 and the AlGaN layer 3. The 2 DHG is generated in the GaN layer 4 adjacent to the interface between the AlGaN layer 3 and the GaN layer 4.

Specifically, the thickness of the AlGaN layer 3, that is, a dimension in the z direction of the AlGaN layer 3 is equal to or greater than 10 nm and equal to or less than 200 nm. Preferably, the thickness of the AlGaN layer 3 is equal to or greater than 30 nm and equal to or less than 120 nm. When the thickness of the AlGaN layer 3 is less than 10 nm, an area density of the 2 DEG is less than $8 \times 10^{12}$ cm$^{-2}$, and an on-resistance of the element is increased. When the thickness of the AlGaN layer 3 is greater than 200 nm, dislocation density involved in easing of strain is increased. In this case, variation of element characteristics is increased to cause drastic decrease of manufacturing yield. Typically, defect density is equal to or greater than $1 \times 10^{11}$ cm$^{-2}$. When the thickness of the AlGaN layer 3 is equal to or greater than 30 nm and equal to or less than 120 nm, the above described material issues do not arise and high concentration of 2 DEG and low defect density are achieved.

The thickness of the GaN layer 4, which is formed on the AlGaN layer 3, needs to be set in the same thickness range for the same reason. Especially, when the thickness of the GaN layer 4 is in a range from 40 nm to 100 nm, an ideal NSJ structure is achieved in which the 2 DHG is generated in the same order as the 2 DEG at the GaN/AlGaN interface corresponding to the interface in which the 2 DHG and the 2 DEG are generated. The range is preferable because the high breakdown voltage of the element is easily achieved.

A thickness ratio AlGaN/GaN of the AlGaN layer 3 and the GaN layer 4 satisfies AlGaN/GaN≤5 and, preferably, satisfies AlGaN/GaN≤2. When the thickness ratio AlGaN/GaN is greater than 5, lattice relaxation of the AlGaN layer 3 occurs. In this case, the 2 DEG and the 2 DHG are not efficiently generated and the resistance is increased. When the thickness ratio AlGaN/GaN is equal to or greater than ½ and equal to or less than 2, the AlGaN/GaN stack structure is formed inheriting a lattice parameter of the lowermost GaN without causing notable easing of strain. The range is preferable because the dislocation and the defect density is restricted equal to or less than $1 \times 10^{11}$ cm$^{-2}$.

A resistivity value of the compound semiconductor substrate may be arbitrarily adjusted by impurity concentrations of the layers of the compound semiconductor substrate depending on desired device characteristics.

The horizontal switching device has a recess 5 extending from the surface of the compound semiconductor substrate to reach the lowermost GaN layer 2, which is the layer of the channel forming layer closest to the substrate 1. The recess 5 does not reach the substrate 1. In the present embodiment, multiple recesses 5 are formed at constant intervals in the y direction. In other words, multiple recesses 5 are periodically formed in the y direction. Each recess 5 has a square pillar shape in which a cross-section in the xy plane is square and facing two sides are parallel to the x direction and the y direction.

The horizontal switching device has a p$^+$-GaN layer 6 providing a gate in each recess 5. The p$^+$-GaN layer 6 is formed of a p-type semiconductor layer. That is, similarly to the recess 5, multiple p$^+$-GaN layers 6 are periodically arranged in the y direction at constant intervals. In other words, the p$^+$-GaN layers 6 are provided by the gate region divided into multiple parts in the y direction. For example, the p$^+$-GaN layer 6 has an impurity concentration equal to or greater than $1 \times 10^{18}$ cm$^{-3}$. By setting the impurity concentration of the p$^+$-GaN layer 6 as above, the p$^+$-GaN layer 6 functions as the gate and restricts a punch through current.

A gate distance corresponding to a distance between adjacent two of the recesses 5 and a distance between adjacent two of the p$^+$-GaN layers 6 is expressed as W. A gate-source distance between the p$^+$-GaN layer 6 and a later described n$^+$-GaN layer 9 providing a source region is expressed as Lgs. A length of the p$^+$-GaN layer 6 in the x direction is expressed as Lgx. The gate distance W is equal to or less than the sum Lgs+Lgx of the gate-source distance Lgs and the length Lgx of the p$^+$-GaN layer 6 in the x direction. A ratio of the gate distance W to the distance Lgs+Lgx is from 0.25 to 1. For example, when the distance Lgs+Lgx is 2 μm, the gate distance W is from 0.5 to 2 μm.

The horizontal switching device includes a recess 7 and a recess 8 at both sides of the p$^+$-GaN layer 6. The recess 7 and the recess 8 extend from the surface of the compound semiconductor substrate to reach the lowermost GaN layer 2 and not to reach the substrate 1. The horizontal switching device includes an n$^+$-GaN layer 9 and an n$^+$-GaN layer 10 in the recess 7 and the recess 8. The n$^+$-GaN layer 9 and the n$^+$-GaN layer 10 provide the source region and a drain region. The n$^+$-GaN layer 9 and the n$^+$-GaN layer 10 are formed of an n-type semiconductor layer. The n$^+$-GaN layer 9 and the n$^+$-GaN layer 10 are positioned apart from the p$^+$-GaN layer 6, and the n$^+$-GaN layer 9 and the n$^+$-GaN layer 10 extend in the y direction.

Since a breakdown voltage is determined by a gate-drain distance Lgd, a size of the horizontal switching device may be designed depending on the desired breakdown voltage. The horizontal switching device includes non-illustrated gate electrode, source electrode and drain electrode on the p$^+$-GaN layer 6, the n$^+$-GaN layer 9 and the n$^+$-GaN layer 10. These electrodes are in ohmic-contact with the p$^+$-GaN layer 6, the n$^+$-GaN layer 9 and the n$^+$-GaN layer 10.

The nitride semiconductor device including the horizontal switching device according to the present embodiment has the configuration described hereinabove and the horizontal switching device operates as follows.

Figure 2:
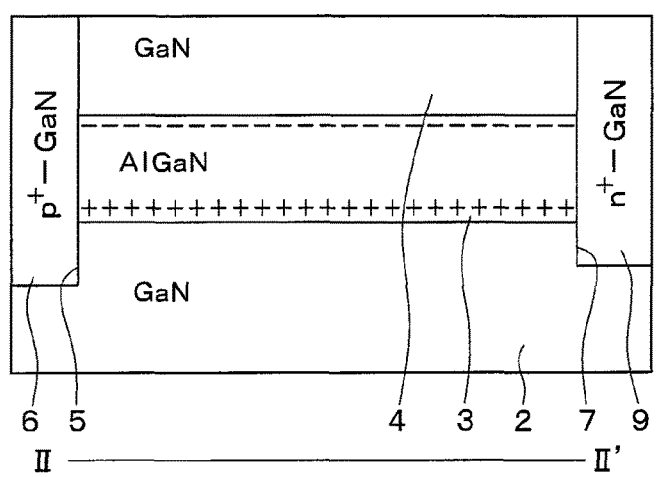
FIG. 2 is a cross-sectional view illustrating charges accumulated in a GaN layer and an interface between an AlGaN layer and the GaN layer in an off state on a line II-II' of FIG. 1.

First, an off state will be described with reference to FIG. 2. When a minus voltage is applied as a gate voltage Vg to the p$^+$-GaN layer 6, that is, when the gate voltage Vg is increased toward a minus value than the source region and the drain region, holes of 2 DHG are decreased by being absorbed from the gate region depending on the gate voltage Vg. At the same time, electrons of 2 DEG are decreased by being absorbed from the source region and the drain region. When the minus voltage of the gate voltage Vg is increased, a depletion state is caused in which electrons and holes do not exist as shown in FIG. 2. The depletion state corresponds to a current cutoff state, that is, a blocking state in which a current does not flow even when a high voltage is applied to the drain region.

Figure 3:
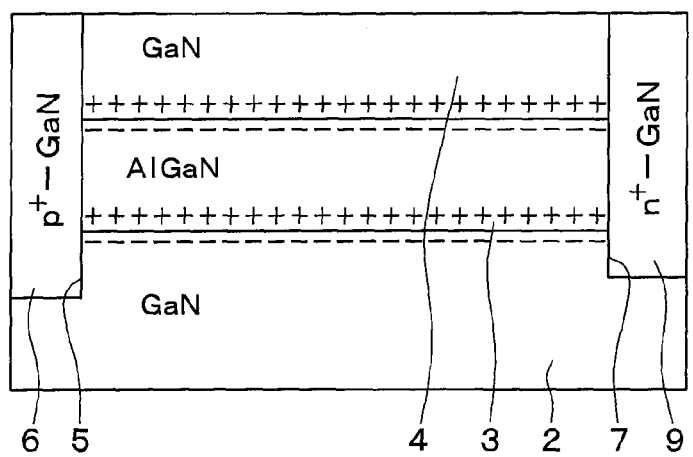
FIG. 3 is a cross-sectional view illustrating charges accumulated in the GaN layer and the interface between the AlGaN layer and the GaN layer in an on state on the line II-II' of FIG. 1.

Next, an on state will be described with reference to FIG. 3. When the gate voltage Vg is not applied to the p$^+$-GaN layer 6, as shown in FIG. 3, a region other than the gate region provided by the p$^+$-GaN layer 6 and a neighborhood of the p$^+$-GaN layer 6 is filled with high density 2 DEG electrons. In this case, the on state in which the source and the drain are conducted is achieved with sufficiently low on-resistance. The current does not flow in a MOS structure channel having high resistance, but flows in the 2 DEG layer having quite low resistance. Therefore, the on-resistance is decreased compared to the MOS structure. The gate distance W is set based on the sum Lgs+Lgx of the gate-source distance Lgs and the length Lgx of the p$^+$-GaN layer 6 in the x direction. Since the gate distance W is set to be relatively broad, an invalidity region in which the current does not flow is reduced and the increase of the resistance is restricted at minimum. Therefore, the on-resistance is further decreased.

Accordingly, the nitride semiconductor device capable of decreasing the on-resistance while securing the high breakdown voltage is provided.

In the case where the minus voltage is applied to the gate region and the total 2 DEG and 2 DHG are drained, plus and minus polarized charge amount are balanced. In this case, the electrical field in the x direction is almost uniform except for the region around the gate region and the drain region. When the electrical field is uniform as described above, the gate-drain distance Lgd to obtain the desired breakdown voltage is shortest. In the present embodiment, since the uniform electrical field is achieved, the gate-drain distance is shortened and the resistance is decreased. Therefore, the on-resistance is further decreased.

Furthermore, in the present embodiment, the gate region is divided into multiple parts and the gate distance W is equal to or less than the sum Lgs+Lgx of the gate-source distance Lgs and the length Lgx of the p$^+$-GaN layer 6 in the x direction. When the electrical field caused by the drain voltage is about to enter the regions between the gate regions in the blocking state, the entering electrical field is restricted. That is, the electrical field caused by the drain voltage is restricted from reaching the source region through the regions between the gate regions, and the punch through current disenabling the blocking state is restricted from flowing between the drain and the source.

The gate region has the structure including the semiconductor without gate insulation film, that is, the structure of the gate region is different from the MOS structure. The gate-drain distance Lgd is shortened regardless of the life of the insulation film in the off state. Therefore, the on-resistance is further decreased.

The gate region that has the structure including the semiconductor allows the holes to enter and exit. The excess holes generating the high electrical field are not accumulated around the gate region in the off state and the degradation of the breakdown voltage is restricted.

Next, a method for manufacturing the horizontal switching device according to the present embodiment will be described with reference to FIG. 4.

Figure 4:
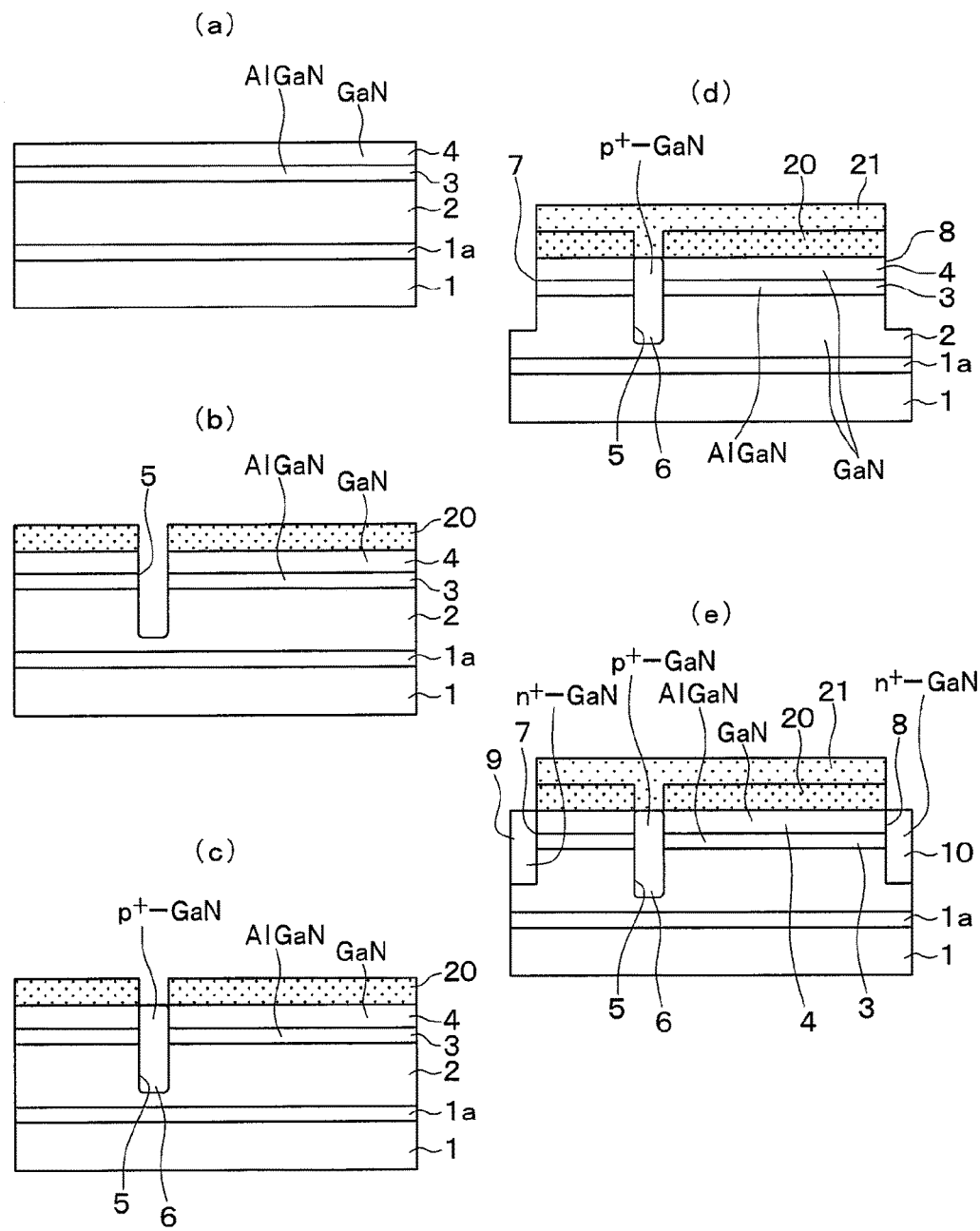
FIG. 4 is a cross-sectional view illustrating a manufacturing method of the nitride semiconductor device according to the first embodiment.

[Step Shown in (a) of FIG. 4]

The compound semiconductor substrate is provided. The compound semiconductor substrate has the structure in which the GaN layer 2, the AlGaN layer 3 and the GaN layer 4 are stacked in order above the surface of the substrate 1 through the buffer layer 1a. The substrate 1 is formed of Si(111). For example, the GaN layer 2, the AlGaN layer 3 and the GaN layer 4 are formed above the surface of the substrate 1 by a Metal Organic Chemical Vapor Deposition (MOCVD) method or a Molecular Beam Epitaxy (MBE) method.

[Step Shown in (b) of FIG. 4]

A mask 20 that is formed of an oxide film (e.g., SiO$_2$) or a nitride film (e.g., SiN) is formed on a surface of the GaN layer 4. Then, the mask 20 is patterned to form an opening at a region at which the p$^+$-GaN layer 6 is to be formed. For example, non-illustrated resist is formed on a surface of the mask 20 and the resist is patterned by a photolithography step. Then, the mask 20 is patterned using the resist. After that, the AlGaN layer 3 and the GaN layer 4 are etched by a dry etching step using the mask 20 to form the recess 5 reaching the lowermost GaN layer 2.

[Step Shown in (c) of FIG. 4]

The surface of the AlGaN layer 3 is covered by the mask 20 and the GaN layer is selectively and epitaxially grown (hereinafter, referred to as a selective epitaxial growth). The p$^+$-GaN layer 6 is selectively and epitaxially grown to implant the recess 5 to a position of the uppermost GaN layer 4. Since the p$^+$-GaN layer 6 is formed by the selective epitaxial growth, the p$^+$-GaN layer 6 is selectively formed in the recess 5.

[Step Shown in (d) of FIG. 4]

A new mask 21 is formed on the mask 20 or the mask 21 is formed after the mask 20 is removed. The mask 20 and the mask 21 are patterned to form openings at regions at which the n$^+$-GaN layer 9 and the n$^+$-GaN layer 10 are to be formed. For example, the mask 21 is formed of the same material as the mask 20 and patterned by a method similar to the mask 20. The AlGaN layer 3 and the GaN layer 4 are etched by a dry etching step using the mask 20 and the mask 21 to form the recess 7 and the recess 8 reaching the lowermost GaN layer 2.

[Step Shown in (e) of FIG. 4]

The surface of the GaN layer 4 is covered by the mask 21 and the GaN layer is selectively and epitaxially grown. The n$^+$-GaN layer 9 and the n$^+$-GaN layer 10 are formed to implant the recess 7 and the recess 8 to a position of the uppermost GaN layer 4. Since the n$^+$-GaN layer 9 and the n$^+$-GaN layer 10 are formed by the selective epitaxial growth, the n$^+$-GaN layer 9 and the n$^+$-GaN layer 10 are selectively formed in the recess 7 and the recess 8.

Although the following steps are not illustrated, an inter-layer-insulation film forming step is conducted in which an inter-layer insulation film is formed to cover the $p^+$-GaN layer 6, the $n^+$-GaN layer 9 and the $n^+$-GaN layer 10 after removing the mask 20 and the mask 21. Then, a contact hole is formed by patterning the inter-layer insulation film. After that, an electrode forming step is conducted in which the gate electrode, the source electrode and the drain electrode are formed through the contact hole. In this way, the nitride semiconductor device including the switching device according to the present embodiment is manufactured.

Second Embodiment

A second embodiment of the present disclosure will be described. In the present embodiment, the structure of the compound semiconductor substrate, specifically, the structure of the channel forming layer is changed from the first embodiment. Since the other parts of the present embodiment are similar to the first embodiment, parts different from the first embodiment will be described.

Figure 5:
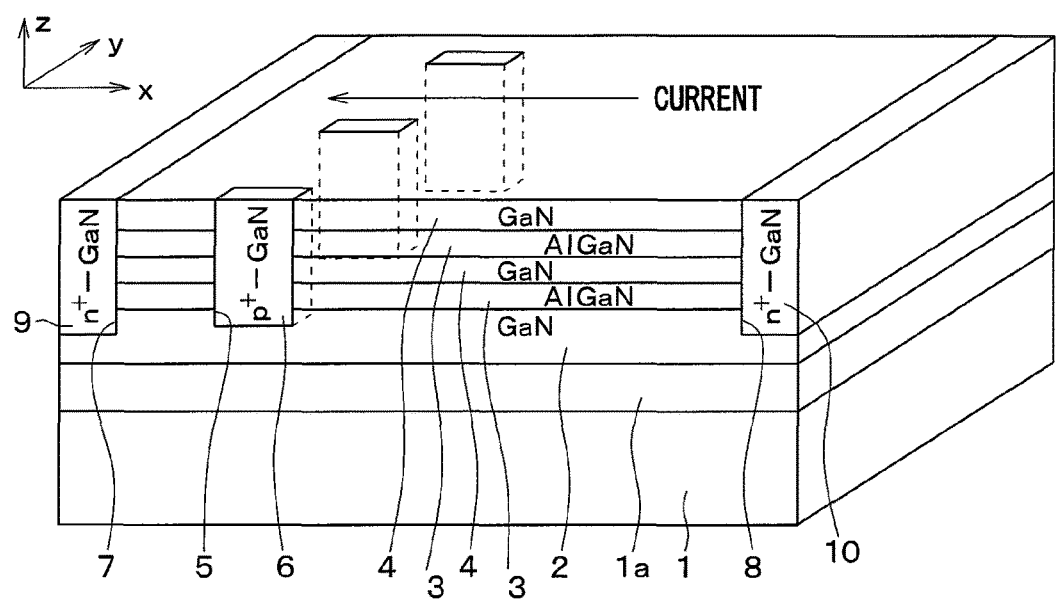
FIG. 5 is a perspective cross-sectional view of a nitride semiconductor device according to a second embodiment of the present disclosure.

As shown in FIG. 5, in the present embodiment, the compound semiconductor substrate includes multiple pairs of the AlGaN layer 3 and the 4 that are repeatedly formed above the GaN layer 2 above the substrate 1. As described in the first embodiment, the thickness, i.e., the dimension in the z direction of the AlGaN layer 3 of each pair is equal to or greater than 10 nm and equal to or less than 200 nm, and preferably equal to or greater than 20 nm and equal to or less than 120 nm. The channel forming layer is provided by a hetero-junction structure of the multiple pairs of the AlGaN layer 3 and the GaN layer 4. Specifically, the 2 DEG carriers are induced by piezoelectric effect and polarization effect in the GaN layer 2 adjacent to the GaN/AlGaN interface between the GaN layer 2 and the AlGaN layer 3, and in the GaN layer 4 adjacent to the GaN/AlGaN interface between the AlGaN layer 3 and the GaN layer 4 of each layer.

Although FIG. 5 shows a structure including only two pairs of the AlGaN layer 3 and GaN layer 4, the compound semiconductor substrate may include three or more pairs of the AlGaN layer 3 and the GaN layer 4.

As described above, in the present embodiment, the pairs of the AlGaN layer 3 and the GaN layer 4 are added to the first embodiment. In this case, plus polarized charges and 2 DEG are generated at an interface between the lower GaN layer 4 and the added AlGaN layer 3, and minus polarized charges and 2 DHG are generated at an interface between the added AlGaN layer 3 and the added GaN layer 4. When furthermore pairs are stacked, the plus polarized charges, the minus polarized charges, the 2 DEG, and the 2 DHG are generated in each interface between the AlGaN layer 3 and the GaN layer 4.

Accordingly, in the present embodiment, multiple pairs of the AlGaN layer 3 and the GaN layer 4 are repeatedly formed and the 2 DEG carriers are generated in the multiple layers. The on-resistance is decreased in almost reverse proportion to the number of the 2 DEG carrier layers. Therefore, the on-resistance is further decreased by generating the 2 DEG carriers in the multiple layers. The on-resistance is further decreased as the number of the pairs of the AlGaN layer 3 and the GaN layer 4 is increased.

Third Embodiment

A third embodiment of the present disclosure will be described. In the present embodiment, the structure of the $p^+$-GaN layer 6 providing the gate region is changed from the first embodiment and the second embodiment. Since the other parts of the present embodiment are similar to the first embodiment and the second embodiment, parts different from the first embodiment and the second embodiment will be described. Although the $p^+$-GaN layer 6 having the structure changed from the first embodiment will be described as an example, the same structure may be employed in the second embodiment.

Figure 6A:
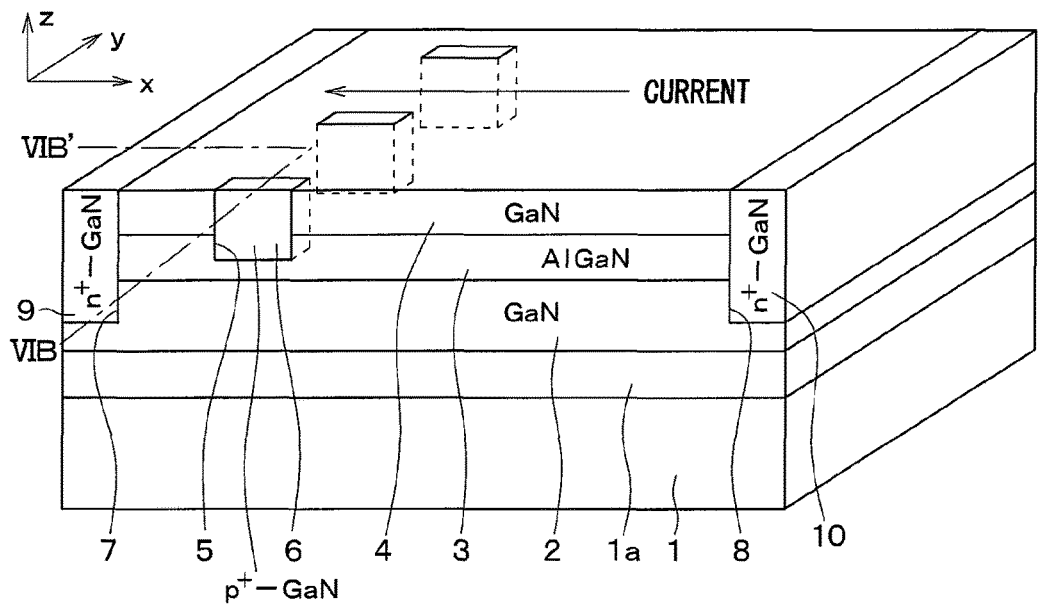
FIG. 6A is a perspective cross-sectional view of a nitride semiconductor device according to a third embodiment of the present disclosure.

As shown in FIG. 6A, in the present embodiment, the $p^+$-GaN layer 6 reaches the lowermost AlGaN layer 3 but does not reach the GaN layer 2. That is, in the present embodiment, the $p^+$-GaN layer 6 reaches an intermediate position of the lowermost AlGaN layer 3.

Also in the present embodiment, the holes are absorbed and the gate region restricts the electrical field of the drain region, that is, similar effects to the first embodiment are achieved.

Figure 6B:
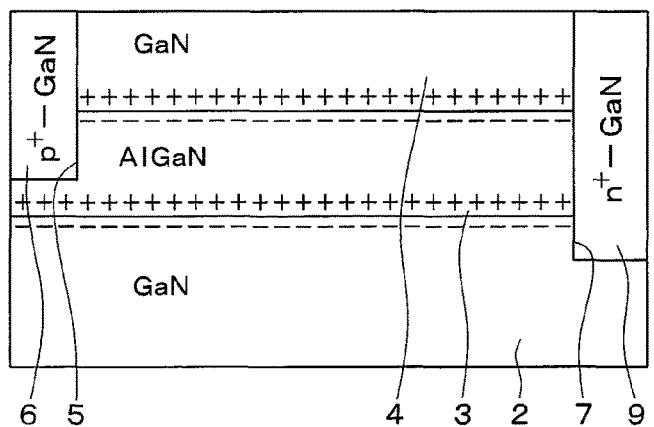
FIG. 6B is a cross-sectional view illustrating charges accumulated in a GaN layer and an interface between an AlGaN layer and the GaN layer in an on state on a line VIB-VIB' of FIG. 6A.

Furthermore, as shown in FIG. 6B, the nitride semiconductor device of the present embodiment does not have a portion in which the GaN layer 2 is disabled by the $p^+$-GaN layer 6. Therefore, the resistance of the gate region is further decreased.

Although the $p^+$-GaN layer 6 reaches the intermediate position of the lowermost AlGaN layer 3 in the present embodiment, similar effects are achieved by the $p^+$-GaN layer 6 reaching an intermediate position of the GaN layer 4.

Fourth Embodiment

A fourth embodiment of the present disclosure will be described. In the present embodiment, the structure of the $p^+$-GaN layer 6 providing the gate region is changed from the first embodiment. Since the other parts of the present embodiment are similar to the first embodiment, parts different from the first embodiment will be described.

Figure 7:
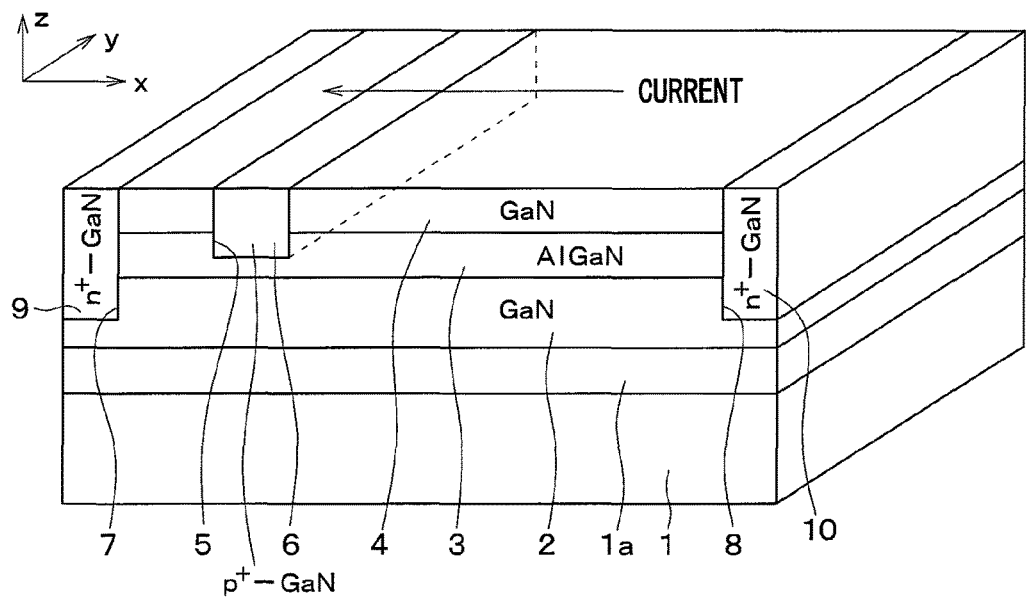
FIG. 7 is a perspective cross-sectional view of a nitride semiconductor device according to a fourth embodiment of the present disclosure.

As shown in FIG. 7, in the present embodiment, the $p^+$-GaN layer 6 reaches the lowermost AlGaN layer 3 but does not reach the GaN layer 2. That is, the $p^+$-GaN layer 6 is positioned above an intermediate position of the AlGaN layer 3 in the thickness direction. Furthermore, the $p^+$-GaN layer 6 continuously extends in the y direction and the $p^+$-GaN layer 6 separates the source region and the drain region.

Also in the present embodiment, the holes are absorbed and the gate region restricts the electrical field of the drain region, that is, similar effects to the first embodiment are achieved. Furthermore, in the present embodiment, the gate region provided by the continuously extending $p^+$-GaN layer 6 restricts the electrical field of the drain region from entering into the gate region. Therefore, the effects of blocking the electrical field are enhanced than the third embodiment.

In the present embodiment, when the multiple pairs of the AlGaN layer 3 and the GaN layer 4 are stacked, the 2 DEG is blocked by the $p^+$-GaN layer 6. Therefore, in the present embodiment, one pair of the AlGaN layer 3 and the GaN layer 4 is provided.

Fifth Embodiment

A fifth embodiment of the present disclosure will be described. In the present embodiment, the structure of the $p^+$-GaN layer 6 providing the gate region is changed from the first embodiment and the second embodiment. Since the other parts of the present embodiment are similar to the first embodiment and the second embodiment, parts different from the first embodiment and the second embodiment will be described. Although the p+-GaN layer 6 having the structure changed from the second embodiment will be described as an example, the same structure may be employed in the first embodiment.

Figure 8:
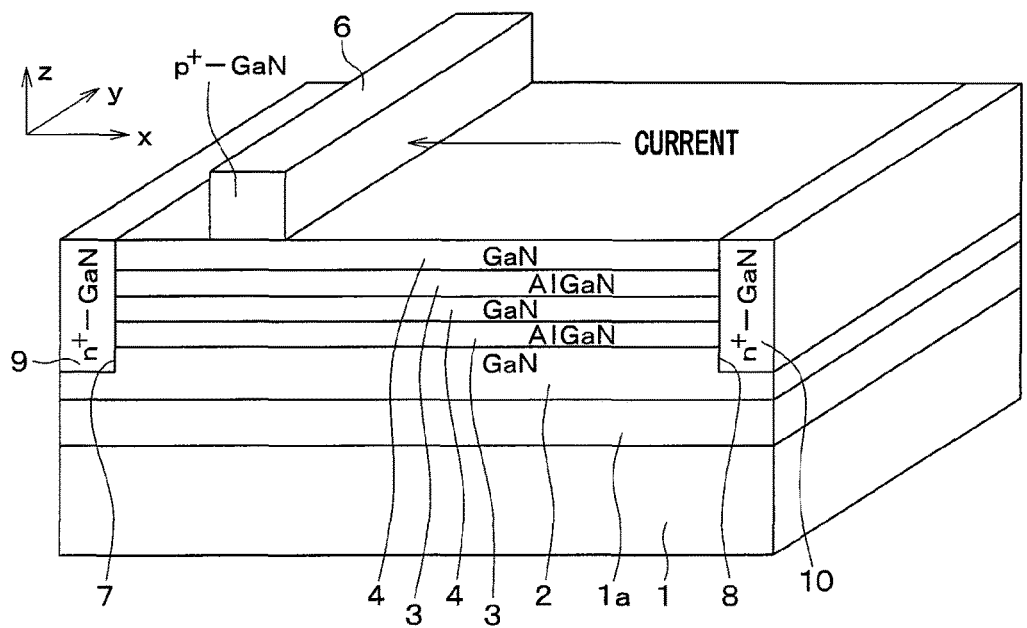
FIG. 8 is a perspective cross-sectional view of a nitride semiconductor device according to a fifth embodiment of the present disclosure.

As shown in FIG. 8, in the present embodiment, the p+-GaN layer 6 continuously extends in the y direction and the p+-GaN layer 6 is positioned on the uppermost GaN layer 4.

When the minus voltage is applied to the p+-GaN layer 6 providing the gate region of the present embodiment, the holes of each 2 DHG layer are absorbed and the gate region restricts the electrical field of the drain region. Therefore, similar effects to the fourth embodiment are achieved.

Furthermore, since the nitride semiconductor device includes multiple layers of the AlGaN layer 3 and the GaN layer 4, the 2 DEG layer is formed in each layer. Therefore, the on-resistance is further decreased.

Sixth Embodiment

A sixth embodiment of the present disclosure will be described. In the present embodiment, elements are added to the first to fifth embodiments. Since the other parts of the present embodiment are similar to the first to fifth embodiments, parts different from the first to fifth embodiments will be described. Although an example in which elements are added to the second embodiment will be described, the same structure may be employed in the first and third to fifth embodiments.

Figure 9:
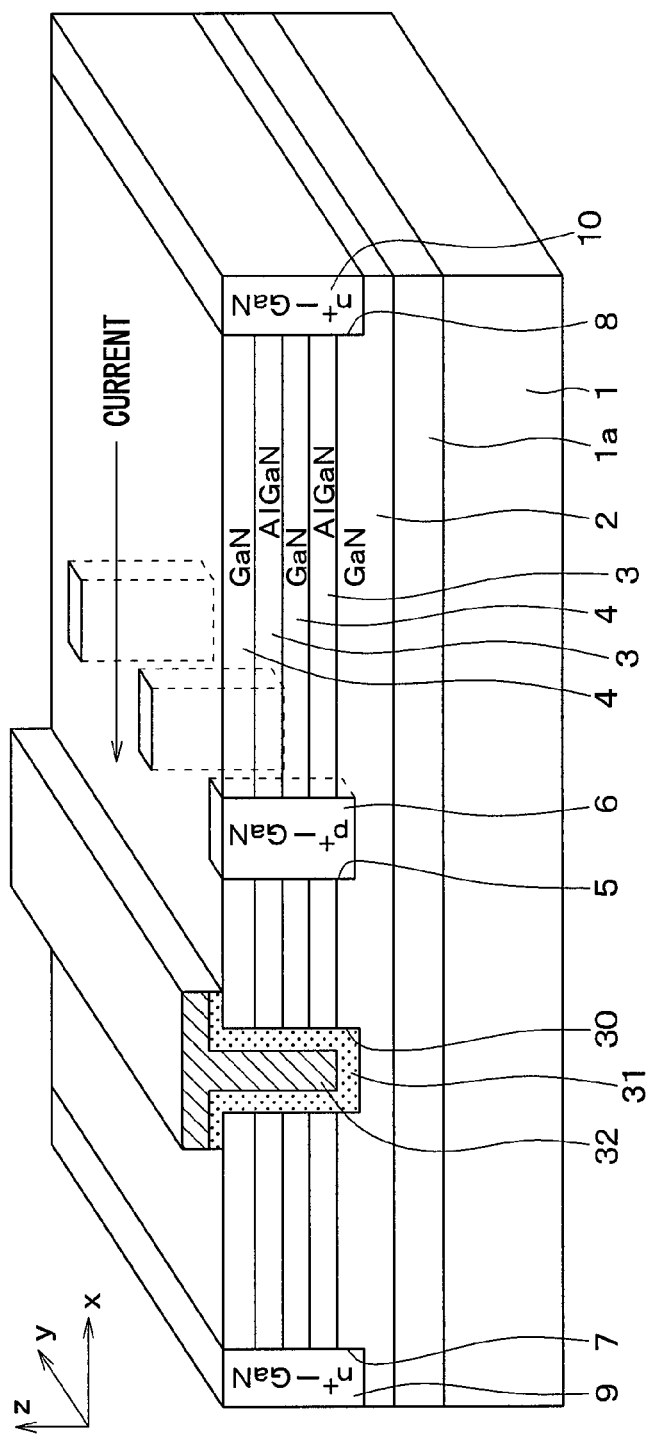
FIG. 9 is a perspective cross-sectional view of a nitride semiconductor device according to a sixth embodiment of the present disclosure.

As shown in FIG. 9, in the present embodiment, the nitride semiconductor device includes a MOS structure between the gate region and the source region. Specifically, the MOS structure includes a recess 30 that extends from the surface of the compound semiconductor substrate and reaches a layer of the channel forming layer closest to the substrate 1. That is, the recess 30 reaches the lowermost GaN layer 2 but does not reach the substrate 1. The MOS structure includes a gate electrode 32 (which is hereinafter referred to as a MOS gate) formed in the recess 30 through a gate insulation film 31. The gate region provided by the p+-GaN layer 6 has a potential fixed at a potential of the source region, e.g., a ground potential.

As described above, the MOS structure is arranged between the gate region and the source region. When a voltage is not applied to the gate electrode 32, a current path of the 2 DEG is blocked by the MOS structure and the normally-off state is more certainly achieved.

Even when the high voltage is applied to the drain region, the gate region has the potential fixed at the potential of the source region and the nitride semiconductor device operates as follows. Therefore, the MOS structure is not applied with the high voltage.

Figure 10:
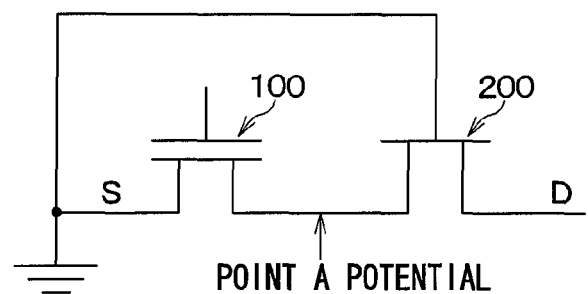
FIG. 10 is a diagram illustrating an equivalent circuit of the nitride semiconductor device shown in FIG. 9.

When the application of the voltage to the gate electrode 32 is suspended and the MOS channel is turned-off, a potential between the MOS structure and the gate region is increased. This state corresponds to a state in which a minus voltage with respect to the potential between the MOS structure and the gate region is applied to the p+-GaN layer 6 providing the gate region. When the minus potential is decreased to be equal to or lower than a threshold voltage Vth, the gate region of the p+-GaN layer 6 reaches a cut-off state. Specifically, as shown by an equivalent circuit of FIG. 10, a MOSFET 100 of the gate electrode 32 and a FET 200 of the p+-GaN layer 6 are arranged in a series manner. When the drain potential of the FET 200 is increased, a potential between the MOSFET 100 and the FET 200, which is a potential at a point A in FIG. 10, is increased. In this case, the gate of the FET 200 has relatively minus potential and the FET 200 reaches the cut-off state. Therefore, even when the drain voltage is further increased, increase of the voltage and increase of the electrical field do not occur in the MOS structure.

Accordingly, the electrical field around the MOS structure is kept at low state. Since the gate insulation film of the MOS structure is not applied with high voltage, the gate-drain distance Lgd needs not to be elongated in view of the life of the gate insulation film. Therefore, the gate-drain distance Lgd is shortened and the resistance is decreased, and thus, the on-resistance is decreased. In the MOS structure, the gate length Lg needs not to be elongated to secure the current blocking characteristics. Therefore, a negative influence of the MOS structure to the on-resistance is decreased. The holes generated in the turning-off are absorbed in the gate region provided by the p+-GaN layer 6. Therefore, the high electrical field caused by the holes accumulated in the turning-off is restricted and the high breakdown voltage is achieved.

Other Embodiments

The dimensions and the manufacturing method of the nitride semiconductor device described in the embodiments are just examples. For example, in the embodiments, the n+-GaN layer 9 and the n+-GaN layer 10 may be formed by ion-insertion of Si. When the n+-GaN layer 9 and the n+-GaN layer 10 are formed by the ion-insertion, the n+-GaN layer 9 and the n+-GaN layer 10 are overlapped with each other and a contact resistance is decreased. Also, since the n+-GaN layer 9 and the n+-GaN layer 10 are formed by the ion-insertion which is relatively simple compared to the selective epitaxial growth, the manufacturing process is simplified.

Although the source region and the drain region are provided by the n+-GaN layer 9 and the n+-GaN layer 10 in the embodiments, the source region and the drain region may be replaced by Shottky electrodes. In this case, the selective epitaxial growth is not conducted and the Shottky electrodes are implanted. Therefore, the manufacturing process is simplified than the implement epitaxial growth.

In the embodiments, the first and the third nitride semiconductor layers providing the channel forming layer and the second nitride semiconductor layer are provided by the GaN layer 2, the AlGaN layer 3 and the GaN layer 4. However, these are just examples and other materials may be employed as far as the channel forming layer is provided by the first and the third nitride semiconductor layers and the second nitride semiconductor layer having greater forbidden band width than the first and the third nitride semiconductor layers.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A nitride semiconductor device comprising a horizontal switching device including:
   a substrate that is formed of a semi-insulator or a semiconductor;
   a channel forming layer that includes a first nitride semiconductor layer disposed above the substrate and a hetero-junction structure disposed above the first nitride semiconductor layer, the first nitride semiconductor layer providing an electron transit layer, the hetero-junction structure including at least one second nitride semiconductor layer and at least one third nitride semiconductor layer, the at least one second nitride semiconductor layer having a forbidden band width greater than the first nitride semiconductor layer and providing an electron donor portion, and the at least one third nitride semiconductor layer having a forbidden band width less than the at least one second nitride semiconductor layer;

a source region and a drain region that are arranged apart from each other in one direction along a plane of the substrate, the source region and the drain region extending from a surface of the channel forming layer and reaching the first nitride semiconductor layer; and a gate region that is formed of a p-type semiconductor layer and is arranged between the source region and the drain region, the horizontal switching device being configured to generate a current between the source region and the drain region by a 2-dimensional electron gas carrier and a 2-dimensional hole gas carrier, the 2-dimensional electron gas carrier being induced in the first nitride semiconductor layer adjacent to an interface between the first nitride semiconductor layer and the at least one second nitride semiconductor layer, and the 2-dimensional hole gas carrier being induced between the at least one second nitride semiconductor layer and the at least one third nitride semiconductor layer positioned above the at least one second nitride semiconductor layer, wherein the gate region is divided into multiple parts stacked behind apart from each other in a perpendicular direction along the plane of the substrate, the perpendicular direction being perpendicular to a horizontal direction in which the source region and the drain region are arranged, the perpendicular direction further being perpendicular to a stack direction in which the first nitride semiconductor layer and the hetero-junction structure of the channel forming layer are stacked.

2. The nitride semiconductor device according to claim 1, wherein the gate region extends from a surface of the channel forming layer and reaches the first nitride semiconductor layer.

3. The nitride semiconductor device according to claim 1, wherein the gate region extends from the surface of the channel forming layer and reaches an intermediate position of the at least one second nitride semiconductor layer or the at least one third nitride semiconductor layer of the channel forming layer in a thickness direction.

4. The nitride semiconductor device according to claim 1, wherein a distance between adjacent two of the multiple parts of the gate region is less than a sum of a distance from the gate region to the source region and a length of the gate region in a direction from the gate region to the source region.

5. The nitride semiconductor device according to claim 1, wherein the at least one second nitride semiconductor layer includes a plurality of second nitride semiconductor layers, the at least one third nitride semiconductor layer includes a plurality of third nitride semiconductor layers, the plurality of second nitride semiconductor layers and the plurality of third nitride semiconductor layers provide multiple pairs each including one of the plurality of second nitride semiconductor layers and one of the plurality of third nitride semiconductor layers, and the multiple pairs are stacked.

6. The nitride semiconductor device according to claim 5, wherein the gate region reaches an intermediate position in a thickness direction of one of the plurality of second nitride semiconductor layers positioned closest to the substrate or one of the plurality of third nitride semiconductor layers positioned closest to the substrate.

7. The nitride semiconductor device according to claim 1, wherein the first nitride semiconductor layer and the at least one third nitride semiconductor layer are formed of GaN, the at least one second nitride semiconductor layer is formed of AlGaN, and the p-type semiconductor layer is formed of p-type GaN.

8. The nitride semiconductor device according to claim 1, further comprising a MOS structure arranged between the gate region and the source region, the MOS structure including:
a recess that extends from the surface of the channel forming layer and reaches the first nitride semiconductor layer;
a gate insulation film that is disposed in the recess; and
a gate electrode that is disposed on the gate insulation film.

9. The nitride semiconductor device according to claim 8, wherein the gate region has a potential fixed at a potential of the source region.

10. A nitride semiconductor device comprising a horizontal switching device including:

a substrate that is formed of a semi-insulator or a semiconductor;

a channel forming layer that includes a first nitride semiconductor layer disposed above the substrate and a hetero-junction structure disposed above the first nitride semiconductor layer, the first nitride semiconductor layer providing an electron transit layer, the hetero-junction structure including at least one second nitride semiconductor layer and at least one third nitride semiconductor layer, the at least one second nitride semiconductor layer having a forbidden band width greater than the first nitride semiconductor layer and providing an electron donor portion, and the at least one third nitride semiconductor layer having a forbidden band width less than the at least one second nitride semiconductor layer;

a source region and a drain region that are arranged apart from each other in one direction along a plane of the substrate, the source region and the drain region extending from a surface of the channel forming layer and reaching the first nitride semiconductor layer; and a gate region that is formed of a p-type semiconductor layer and is arranged between the source region and the drain region, the horizontal switching device being configured to generate a current between the source region and the drain region by a 2-dimensional electron gas carrier and a 2-dimensional hole gas carrier, the 2-dimensional electron gas carrier being induced in the first nitride semiconductor layer adjacent to an interface between the first nitride semiconductor layer and the at least one second nitride semiconductor layer, and the 2-dimensional hole gas carrier being induced between the at least one second nitride semiconductor layer and the at least one third nitride semiconductor layer positioned above the at least one second nitride semiconductor layer, wherein the source region and the drain region are arranged in a first row in a horizontal direction, the gate region is divided into multiple parts stacked behind apart from each other that are arranged in a second row in a perpendicular direction along the plane of the substrate, and the perpendicular direction is perpendicular to the horizontal direction.

\* \* \* \* \*